(12) United States Patent
Kawamura et al.

(10) Patent No.: US 7,557,373 B2
(45) Date of Patent: Jul. 7, 2009

(54) THIN-FILM TRANSISTOR SUBSTRATE INCLUDING PIXEL REGIONS WHERE GATE ELECTRODE LINES ARE ARRAYED ON AN INSULATING SUBSTRATE, AND DISPLAY THEREWITH

(75) Inventors: Tetsuya Kawamura, Fukaya (JP); Katsuhiko Inada, Kumagaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 420 days.

(21) Appl. No.: 11/084,136

(22) Filed: Mar. 21, 2005

(65) Prior Publication Data

US 2005/0218402 A1 Oct. 6, 2005

(30) Foreign Application Priority Data

Mar. 30, 2004 (JP) ............... P2004-100291
Feb. 8, 2005 (JP) ............... P2005-032053

(51) Int. Cl.
*H01L 29/04* (2006.01)
*H01L 29/12* (2006.01)

(52) U.S. Cl. ............... 257/59; 257/71; 257/72
(58) Field of Classification Search ............... 257/82, 257/88, 100, 59, 67, 68, 71, 72, E27.111, 257/E27.131
See application file for complete search history.

(56) References Cited

U.S. PATENT DOCUMENTS

| | | | |
|---|---|---|---|
| 5,585,290 A | 12/1996 | Yamamoto et al. | |
| 5,953,595 A | 9/1999 | Gosain et al. | |
| 6,255,130 B1 | 7/2001 | Kim | |
| 6,515,720 B1 | 2/2003 | Iizuka et al. | |
| 6,597,415 B2 * | 7/2003 | Rho et al. ............... 349/42 |
| 6,821,176 B2 | 11/2004 | Lee et al. | |
| 6,933,568 B2 * | 8/2005 | Yang et al. ............... 257/347 |
| 7,220,991 B2 * | 5/2007 | Hong et al. ............... 257/59 |
| 2004/0113444 A1 | 6/2004 | Blonigan et al. | |
| 2005/0020177 A1 | 1/2005 | Lee et al. | |

FOREIGN PATENT DOCUMENTS

| JP | 8-125189 | 5/1996 |
|---|---|---|
| JP | 2000-277587 | 10/2000 |
| JP | 2001-021859 | 1/2001 |
| JP | 2001-305575 | 10/2001 |

(Continued)

*Primary Examiner*—Hung Vu
(74) *Attorney, Agent, or Firm*—Oblon, Spivak, McClelland, Maier & Neustadt, P.C.

(57) ABSTRACT

A thin-film transistor substrate includes a pixel region where gate electrode lines are arranged on an insulating substrate sandwiching semiconductor layer patterns and a gate insulator with the insulating substrate, wherein shapes of the semiconductor patterns and the gate electrode lines are set so that a value of K obtained by the following equation is smaller than a first set value when the thin-film transistor substrate is mounted on a metal table:

$$K=(L/Ce)\times\{Ca/(Ca+Cb)\}\times S$$

where Ca represents a capacitor between each of the semiconductor layer patterns and the metal table, Cb represents a capacitor between each of the semiconductor layer patterns and the gate electrode lines, Ce represents a capacitor between each of the gate electrode lines and the metal table, L represents a length of each of the gate electrode line, and S represents a substrate surface area that one of the gate electrode lines are in charge of per unit length.

7 Claims, 11 Drawing Sheets

FOREIGN PATENT DOCUMENTS

| | | |
|---|---|---|
| JP | 2003-255297 | 9/2003 |
| TW | 148837 | 1/1991 |
| TW | JP 06-267912 | 9/1994 |
| TW | JP 11-160732 | 6/1999 |
| TW | JP 2000-349292 | 12/2000 |
| TW | 513589 B | 12/2002 |
| TW | 531718 | 5/2003 |
| TW | 558709 | 10/2003 |

* cited by examiner

TRANSFER FROM CVD CHAMBER

ELECTRO STATIC DISCHARGE

CVD CHAMBER $C1 = \Sigma C1(m)$
$C2 = \Sigma C2(n)$
$\quad C2(1) = C2a(1) * C2b(1)/(C2a(1) + C2b(1))$ $Ce' = \Sigma C1(m) + \Sigma C2(n)$ REGRESSION PLOT
C3=5.84525−28.3463C1
+40.5104C1**2
S=3.83060 R-Sq=98.5% R-Sq(adj)=97.7%

REGRESSION PLOT
C3=−4.76836+0.0221527C1
+0.0001921C1**2
S=6.24106 R-Sq=95.9% R-Sq(adj)=93.8%

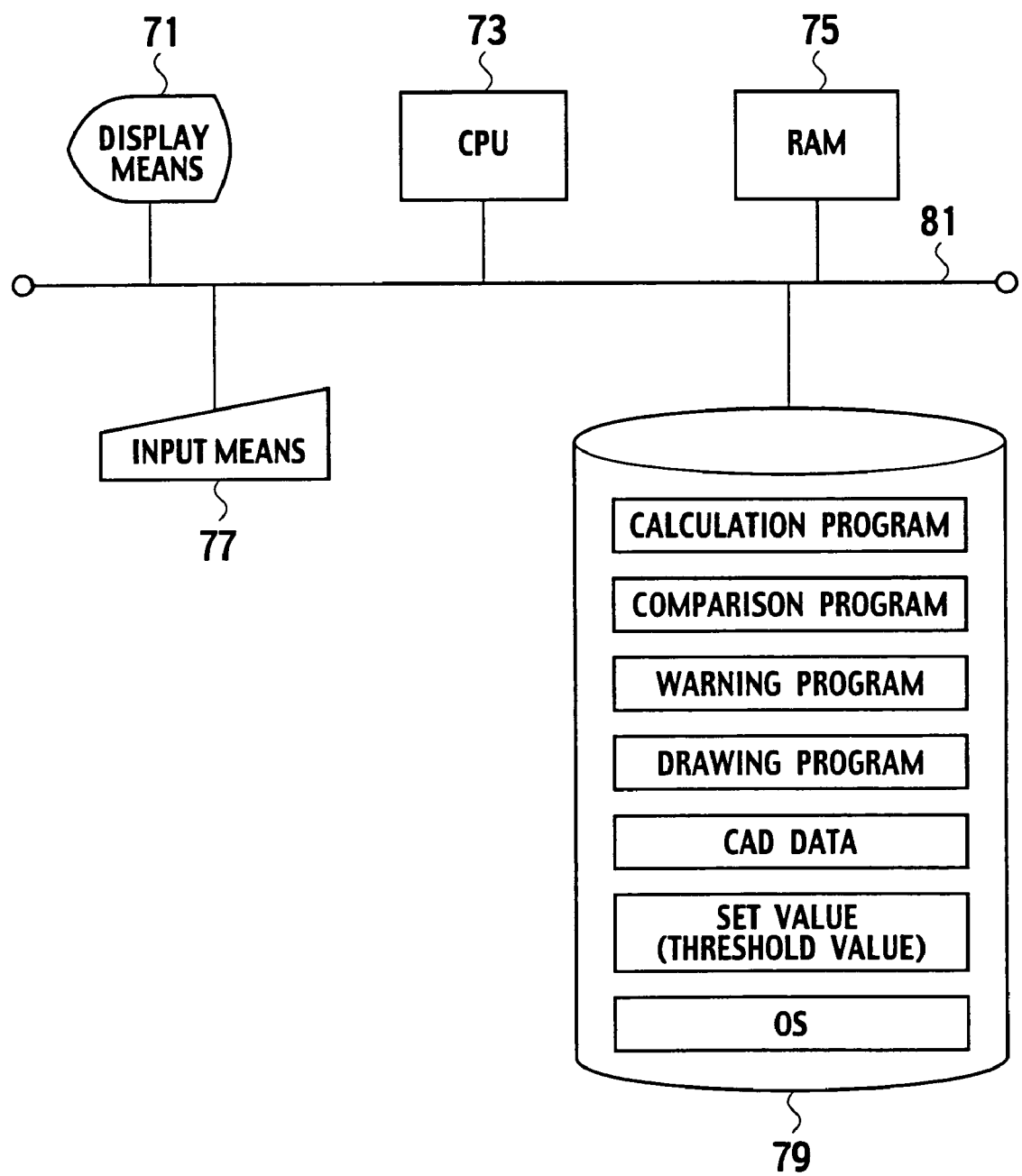

CVD CHAMBER

TRANSFER FROM CVD CHAMBER

THIN-FILM TRANSISTOR SUBSTRATE INCLUDING PIXEL REGIONS WHERE GATE ELECTRODE LINES ARE ARRAYED ON AN INSULATING SUBSTRATE, AND DISPLAY THEREWITH

CROSS REFERENCE TO RELATED APPLICATIONS

This application is based upon and claims the benefit of priority from Japanese Patent Applications P2004-100291 filed on Mar. 30, 2004 and P2005-32053 filed on Feb. 8, 2005; the entire contents of which are incorporated by reference herein.

BACKGROUND OF THE INVENTION

1. Field of the Invention

The present invention relates to a thin-film transistor substrate obtained by forming thin-film transistors (TFTs) on an insulating substrate, a display device formed by combining the thin-film transistor substrate and a display material such as a liquid crystal material and an EL material, and a CAD for designing the thin-film transistor substrate and the display device. The present invention also relates to a transfer method for the thin-film transistor substrate, which prevents breakage of wiring lines caused by static electricity.

2. Description of the Related Art

FIG. 1 shows a structure of a crystal display device and a schematic circuit diagram of a thin-film transistor substrate used for the display device. In a pixel region 1, pixels (display dots) 2 are arranged in a matrix. In each pixel 2, a pixel electrode 3, a storage capacitor 4, and a pixel transistor 5 are arranged. The pixel electrode 3 and a counter electrode 6 (in practice, a large electrode provided throughout the whole pixel region 1) sandwich liquid crystal 7 therebetween.

Each pixel transistor (thin-film transistor) 5 is connected to a gate electrode line (scan line) 8 and an image signal line 9, and each storage capacitor 4 is connected to a common capacitor line 10. The gate electrode lines 8 are connected to a gate line driving circuit 11, the image signal lines 9 are connected to a signal line driving circuit 12, and the common capacitor lines 10 are connected to a capacitor line driving circuit 13 (for example, see Japanese Patent Laid-Open Publication No. 2000-187248).

Other various components including a system circuit and a polarizer, as well as a backlight are further added to and combined with the structure shown in FIG. 1, completing a liquid crystal display device. In this structure, the pixel electrodes 3, the storage capacitors 4, the pixel transistors 5, the gate electrode lines (scan lines) 8, the image signal lines 9, and the common capacitor lines 10 are formed on an insulating substrate, configuring a thin-film transistor substrate.

With regard to a thin-film transistor substrate where polysilicon (Si) is used for thin-film transistors, the gate line driving circuit 11, the signal line driving circuit 12, and the capacitor line driving circuit 13 may be formed on the same insulating substrate.

FIGS. 2A and 2B are schematic views of the half-manufactured liquid crystal display device shown in FIG. 1 and depict four pixels formed in the pixel region on the thin-film transistor substrate. FIG. 2A is a schematic plan view of the same and FIG. 2B is a schematic cross-sectional view taken along the line α-β in FIG. 2A.

As shown in FIG. 2A, each gate electrode line 8 intersects with a plurality of semiconductor layer patterns 20. The common capacitor lines 10 are formed parallel to the gate electrode line 8. Quadrangles drawn by a dotted line represent positions where the image signal lines 9 are to be formed.

As shown in FIG. 2B, an undercoat film 22 is formed on an insulating substrate 21, and the semiconductor layer patterns 20 and a gate insulator 23 are formed on the undercoat film 22. The gate electrode lines 8 are then formed on the gate insulator 23, and an interlayer insulator 24 is formed on the gate electrode lines 8.

Such display device (a liquid crystal display device) as shown in FIGS. 1 and 2, where each display pixel has a thin-film transistor, requires an enormous number of pixels to display a large amount of data. In the case of a typical screen (for example, 1024*768 pixels) of a personal computer, where the RGB colors are made of three pixels (i.e. one pixel forms one color) there will be as many as several millions of pixels that need to be formed. As the demand for display quality has been increasing every year, the demand for display devices having the fewest possible (minimum) point defects due to pixel failures has also been on the rise. However, at manufacturing sites, it is very difficult to fabricate display devices having no point defects at all with good yield, and it is thus very important to provide display device structures with a fewest possible point defects and a manufacturing method for such display devices.

One of significant causes of point defect is electro static discharge which occurs when forming a thin-film transistor substrate. In particular, during a period between formation of the gate electrode lines 8 and formation of the image signal lines on a top-gate-type thin-film transistor substrate, high voltage is likely to be generated between each substrate layer pattern 20 and each gate electrode line 8, and electro static discharge is also likely to occur during the period. Deposition and washing processes after formation of the gate electrode lines 8 as well as transfer (movement of substrates) in these processes are of particular problems.

FIGS. 3A and 3B are schematic explanatory views showing a deposition process for the interlayer insulator after formation of the gate electrode lines, and electro static discharge that occurs while the substrate is being transferred, respectively. FIG. 3A shows a state within a plasma CVD chamber 25 where the semiconductor layer patterns (polysilicon) 20 and the gate electrode line 8 are formed on the substrate 20 together with the undercoat film and gate insulator, and an insulator (for example, silicon oxide or silicon nitride) is adhered onto the gate electrode line 8 by plasma CVD as the interlayer insulator 24. In this state, the entire substrate is charged. Since the substrate and its surface (the interlayer insulator) are made of an insulating material, complete static elimination is difficult.

FIG. 3B is a schematic explanatory view of electro static discharge during transfer of the substrate. During transfer of the substrate 21 from the state shown in FIG. 3A, once the semiconductor layer pattern 20 comes to a position above a substrate support portion 40 of an arm of a substrate transfer robot, electro static discharge (depicted symbolically) often occurs in the semiconductor layer pattern 20.

An object of the present invention is to provide a thin-film transistor substrate which can suppress point defect caused by such electro static discharge, improving manufacturing yield.

SUMMARY OF THE INVENTION

A first characteristic of the present invention is a thin-film transistor substrate including a pixel region where gate electrode lines are arranged on an insulating substrate sandwiching semiconductor layer patterns and a gate insulator with the insulating substrate, wherein shapes of the semiconductor patterns and the gate electrode lines are set so that a value of K obtained by the following equation is smaller than a first set value when the thin-film transistor substrate is mounted on a metal table:

$$K=(L/Ce)\times\{Ca/(Ca+Cb)\}\times S$$

where Ca represents a capacitor between each of the semiconductor layer patterns and the metal table, Cb represents a capacitor between each of the semiconductor layer patterns and the gate electrode lines, Ce represents a capacitor between each of the gate electrode lines and the metal table, L represents a length of each of the gate electrode line, and S represents a substrate surface area that one of the gate electrode lines are in charge of per unit length.

A second characteristic of the present invention is a thin-film transistor substrate including pixel regions where gate electrode lines are arrayed on an insulating substrate sandwiching semiconductor layer patterns and gate insulators with the substrate, wherein shapes of the semiconductor layer patterns and the gate electrode lines are set so that a value of k' obtained from the following equation is smaller than a third set value when the thin-film transistor substrate is mounted on a metal table:

$$k'=(L/Ce')\times\{Ca'/(Ca'+Cb')\}\times S$$

where capacitors constructing a capacitor between each of the semiconductor layer patterns and the metal table, a capacitor between each of the semiconductor layer patterns and each of the gate electrode lines, and a capacitor between each of the gate electrode lines and the metal table are calculated approximately as parallel plate capacitors of overlap areas, respectively, in other words, a parallel plate capacitor made between each of the semiconductor layer patterns and a projected pattern of the semiconductor layer pattern to a surface of the metal table is represented by Ca', a parallel plate capacitor made only by an overlap area between each of the semiconductor layer patterns and each of the gate electrode lines is represented by Cb', and a capacitor between each of the gate electrode lines and the metal table, obtained by composition calculation using Ca' and Cb', is represented by Ce', a length of each of the gate electrode lines is represented by L, and a substrate surface area that one of the gate electrode lines is in charge of per unit length is S.

A third characteristic of the present invention is a display device comprising the thin-film transistor substrate having a first characteristic of the present invention; and a display material such as a liquid crystal material and an EL material.

A fourth characteristic of the present invention is a CAD program for designing shapes of semiconductor layer patterns and gate electrode lines, wherein a computer is caused to calculate a capacitor Ca between each of the semiconductor layer patterns and a metal table, a capacitor Cb between each of the semiconductor layer pattern and each of the gate electrode lines, a capacitor Ce between each of the gate electrode lines and the metal table, in a case where a thin-film transistor substrate is mounted on the metal table; the computer is caused to calculate a value of K based on the capacitor Ca, the capacitor Cb, the capacitor Ce, as well as a length L of each of the gate electrode lines, a substrate surface area S that one of the gate electrode lines is in charge of per unit length, and an equation $$K=(L/Ce)\times\{Ca/(Ca+Cb)\}\times S,$$

the computer is caused to compare the value of K to a first set value, and the computer is caused to display a warning where the value of K is smaller than the first set value.

A fifth characteristic of the present invention is a transfer method for a thin-film transistor substrate in which a pixel region and a driving circuit region are arrayed on an insulating substrate, the pixel region being configured by pixels including thin-film transistors, respectively, and the driving circuit region mounting driving circuits for driving the thin-film transistors, wherein a substrate support portion provided in transfer means transfers the thin-film transistors while supporting the thin-film transistors at support points set on a bottom side of the thin-film transistor substrate and outside the pixel region.

BRIEF DESCRIPTION OF THE DRAWINGS

FIG. 2A is a schematic plan view thereof and FIG. 2B is a schematic cross-sectional view taken along the line α-β of the FIG. 2A;

FIG. 6A shows a defect rate when n=1 and FIG. 6B shows same when n=2;

FIG. 7 is a functional block diagram showing a structure of a CAD system of a second embodiment of the present invention;

DETAILED DESCRIPTION OF THE PREFERRED EMBODIMENTS

Embodiments of the present invention are described below with reference to the drawings, but the present invention is not limited to these embodiments. In descriptions of the drawings below, the same or similar numerals are used to designate the same or similar parts.

First Embodiment

Figure 4:
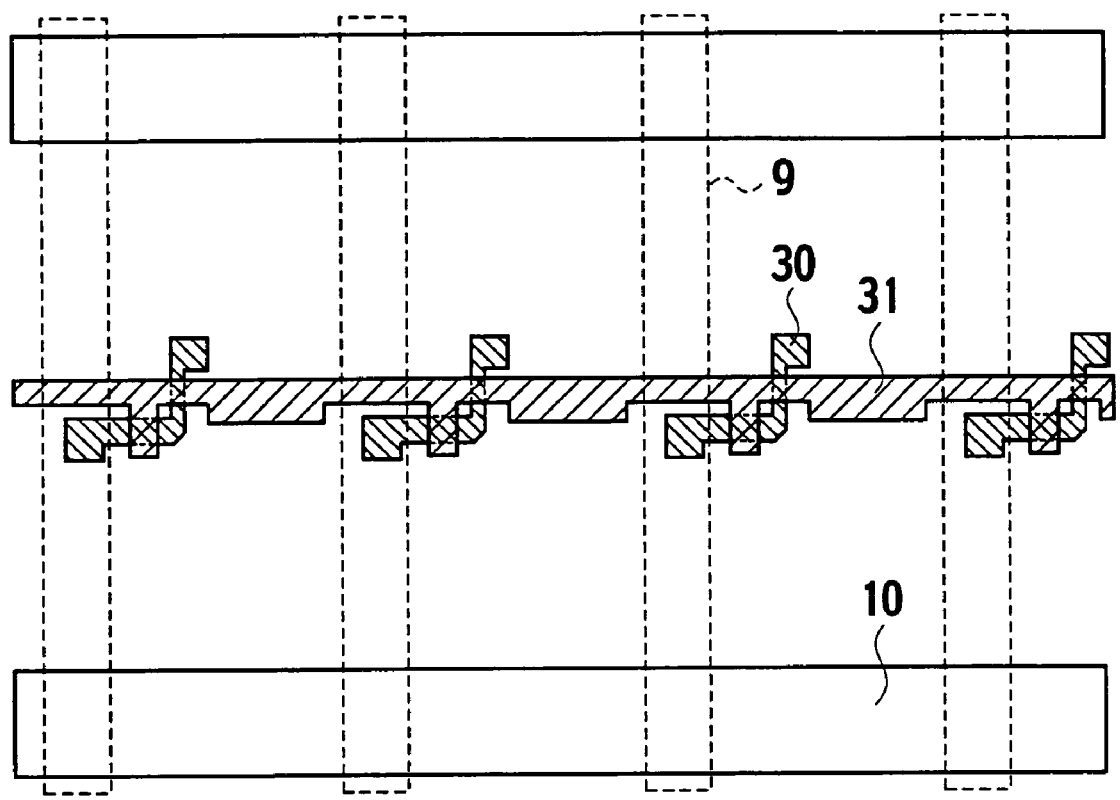
FIG. 4 is a schematic view for explaining a thin-film transistor substrate of a first embodiment of the present invention.

FIG. 4 is a schematic view for explaining a thin-film transistor substrate of the first embodiment of the present invention. Similarly to FIG. 2A, this is a schematic plan view of a half-manufactured thin-film transistor substrate. The basic structure of the main part of the thin-film transistor substrate is almost the same as those shown in FIGS. 2A and 2B.

Figure 1:
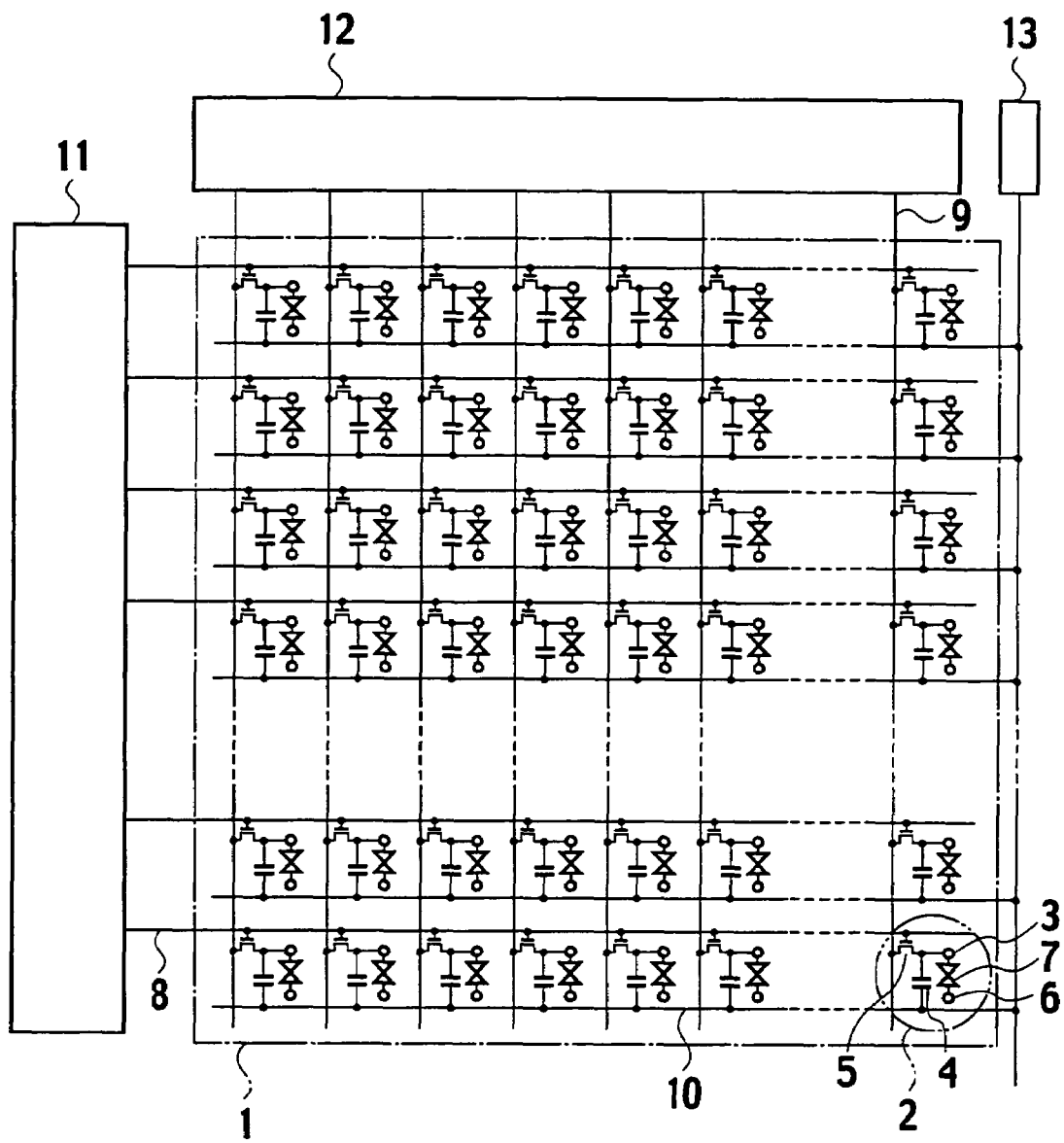
FIG. 1 is a schematic circuit diagram showing a structure of a crystal liquid display device and a thin-film transistor substrate used for the display device.
Figure 2A:
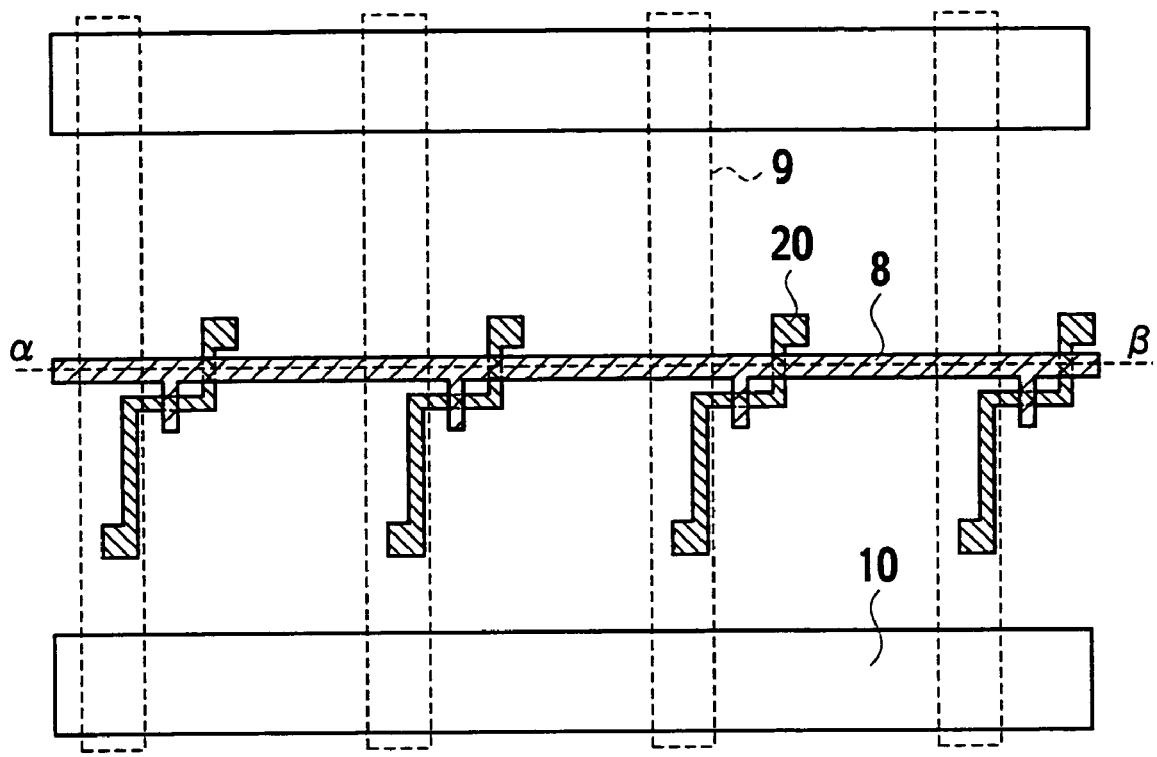
FIGS. 2A and 2B are schematic views of half-manufactured liquid crystal display device shown in FIG. 1.
Figure 2B:
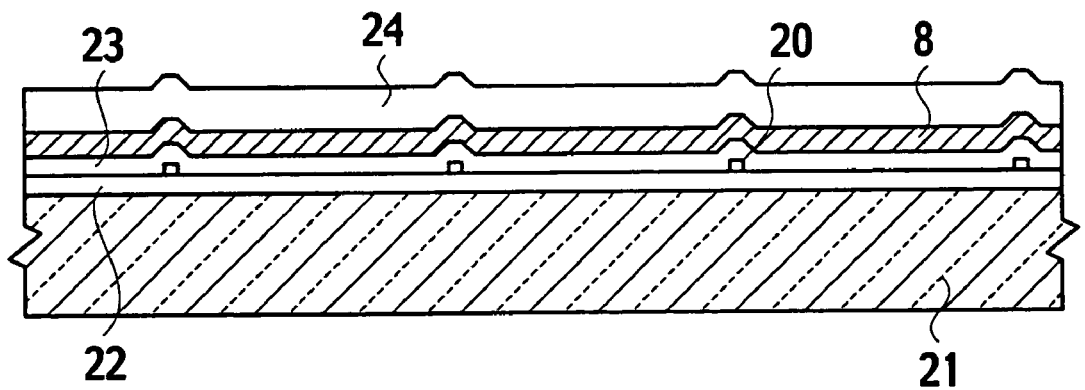
Figure 3B:
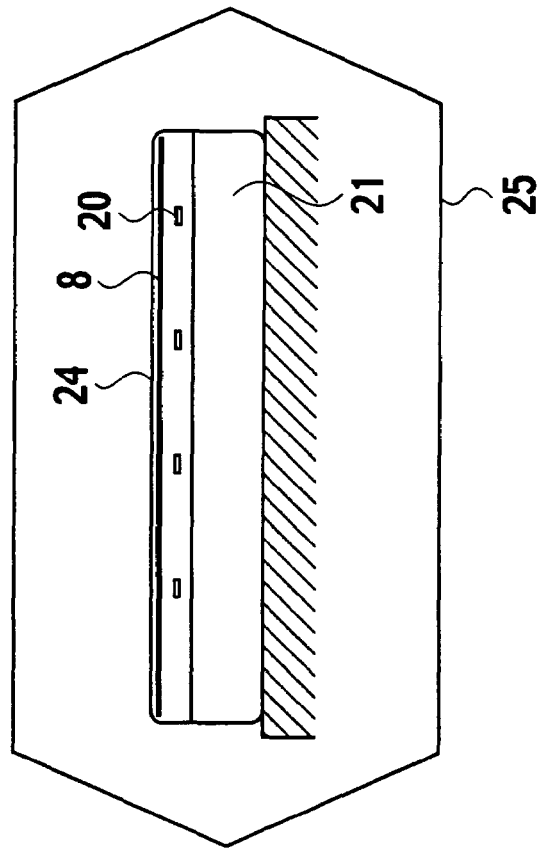
FIG. 3A is an explanatory view of a deposition process for an interlayer insulator after formation of gate electrode lines and FIG. 3B is a schematic explanatory view of electro static discharge during transfer of the substrate.
Figure 3A:
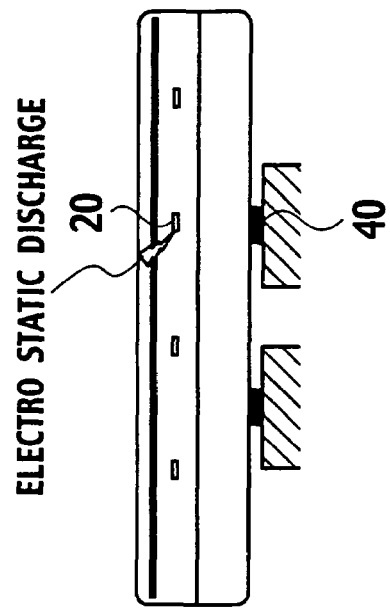

However, in the first embodiment, an area of each semiconductor layer pattern 30 is smaller than that of each conventional semiconductor layer pattern 20 (in FIG. 2A);

an area of each electrode line pattern 31 is larger than that of each conventional gate electrode line pattern 8 (in FIG. 2A); and an overlap area between each gate electrode line pattern 31 and each semiconductor layer pattern 30 is increased.

The rest of the structure is basically the same as that of the conventional example, and descriptions thereof are thus omitted. In the first embodiment, the thin-film transistors are of the top-gate type using polysilicon semiconductor layer patterns 30 fabricated by melt crystallization using excimer laser. The gate electrode lines (scan lines) 31 are made of a molybdenum (Mo) alloy, and image signal lines 9 are made of a multilayered film of an aluminum (Al) film and a refractory metal film. A gate insulator is a silicon oxide film (with a film thickness of 150 nm) made by plasma CVD, an interlayer insulator is made of a multilayered film of a silicon nitride film and a silicon oxide film (with film thicknesses of 350 nm and 450 nm, respectively) also made by plasma CVD. The gate line driving circuit 11, the signal line driving circuit 12 and the capacitor driving circuit 13 are also formed on an insulating substrate (Corning's glass substrate #1737: 730 mm×920 mm, thickness: 0.7 mm).

A parallel plate capacitor Ca' made by a semiconductor layer pattern, where electro static discharge is feared to occur, and a projected pattern of the semiconductor pattern to the surface of a metal table is set at $2.44 \times 10^{-5}$ pF. A parallel plate capacitor Cb' made only of an overlap area between the semiconductor layer pattern and the gate electrode line is set at $1.82 \times 10^{-2}$ pF. A parallel plate capacitor Ce' made between the gate electrode line and the metal table is set at $4.79 \times 10^{-1}$ pF. The length L of the gate electrode line is set at 343.4 mm, and a substrate surface area S which each gate electrode line is in charge of per unit area is set at 0.272 mm².

Figure 5:
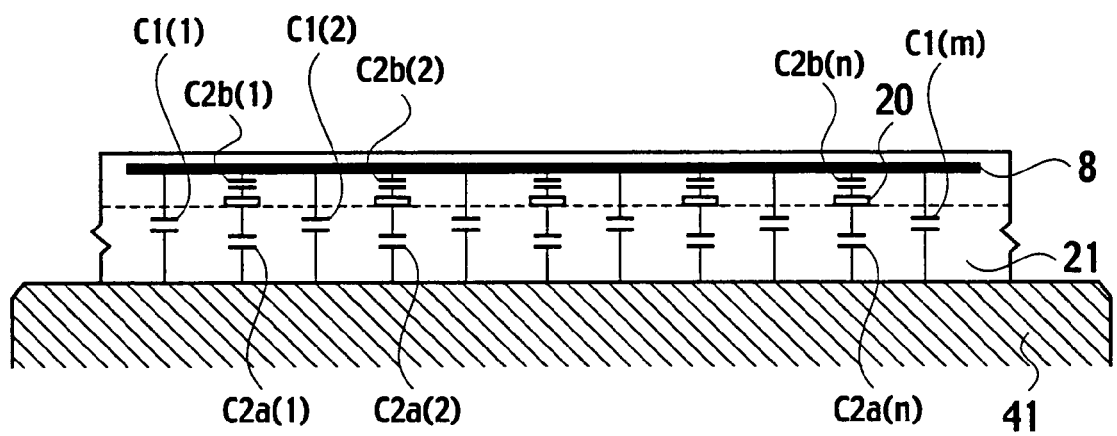
FIG. 5 is a view explaining an approximate value Ce' of a capacitor between gate electrode lines and a metal table.

The parallel plate capacitor Ce' is described using FIG. 5. As shown in FIG. 5, Ce' is obtained by approximate calculation where all the capacitors that constitute Ce' are regarded as the parallel plate capacitors. For example, a gate electrode line in a pixel region overlaps the semiconductor layer patterns at n points. It may also be the case that a semiconductor layer pattern overlaps a gate electrode line at two points. Hence, the equation of n=(the number of semiconductor layer patterns overlapping a gate electrode layer) is not always established. Of the gate electrode line, areas which do "not" overlap the semiconductor layer patterns are represented by regions 1, and areas which "do" overlap the semiconductor layer patterns are represented by regions 2.

Where the regions 1 are constituted by m portions of areas, and these areas are represented by a region 1(1), a region 1(2), . . . and a region 2 (m), respectively;

the regions 2 are constituted by n portions of areas, and these areas are represented by a region 2 (1), a region 2 (2), . . . and a region 2 (n), respectively;

parallel plate capacitors made of the respective regions 1 and their own projected patterns to the surface of a metal table are represented by C1 (1), C1 (2), . . . and C1 (m), respectively; and capacitors between the respective regions 2 and their own projected patterns to the surface of the metal table though the semiconductor layer patterns are represented by C2 (1), C2 (2), . . . and C2 (n), respectively, $$Ce' = \Sigma C1(m) + \Sigma C2(n)$$

can be established.

The capacitor C2(1) of the region 2(1) can be obtained by the equation:

$$C2(1) = C2a(1) * C2b(1)/(C2a(1) + C2b(1))$$

where C2b(1) represents a capacitor of an overlap portion between the gate electrode line and a semiconductor layer pattern and C2a(1) represents a capacitor made between the semiconductor layer pattern and its own projected pattern to the surface of the metal table.

Similarly, the capacitor C2(n) of the region 2(n) can be obtained by the equation:

$$C2(n) = C2a(n) * C2b(n)/(C2a(n) + C2b(n))$$

where C2b(n) represents a capacitor of an overlap portion between the gate electrode line and a semiconductor layer pattern, and C2a(n) represents a capacitor made between the semiconductor layer pattern and its own projected pattern to the surface of the metal table.

The value of k' is obtained by substituting these values of Ca', Cb', Ce' as well as those of L and S into the following equation.

$$k' = (L^n/Ce') \times \{Ca'/(Ca' + Cb')\} \times S$$

As a result, k' becomes 0.261 where n=1, and k' becomes 89.7 where n=2. At the same time, defects due to electro static discharge are dramatically decreased in the deposition process for the interlayer insulator.

Figure 6A:
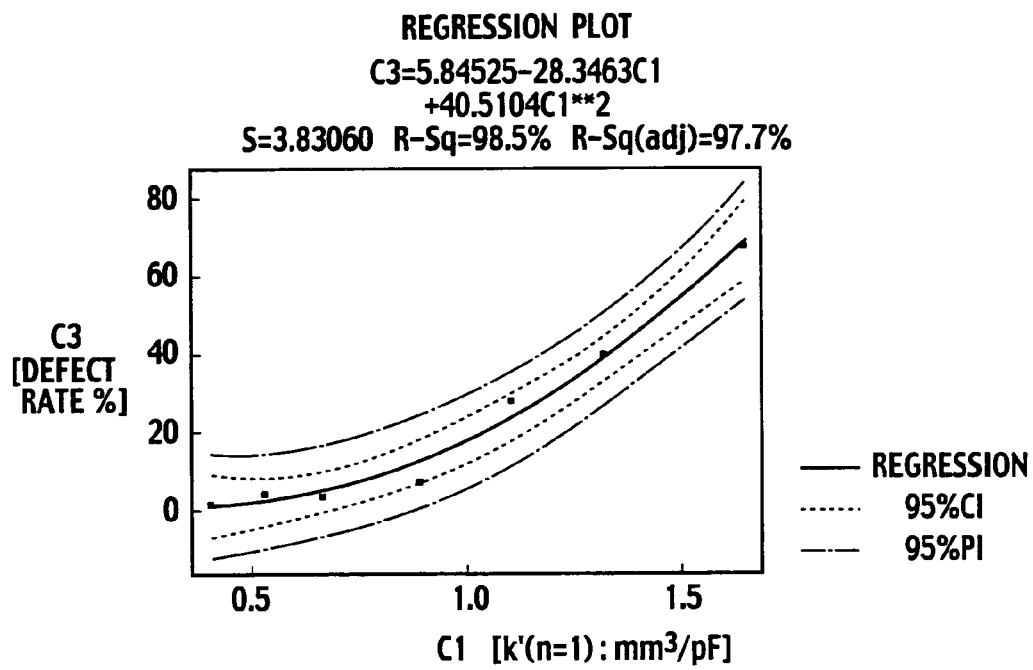
FIGS. 6A and 6B are graphs both showing values of k' on their horizontal axes and defect rates attributed to electro static discharge on the on their vertical axes.
Figure 6B:
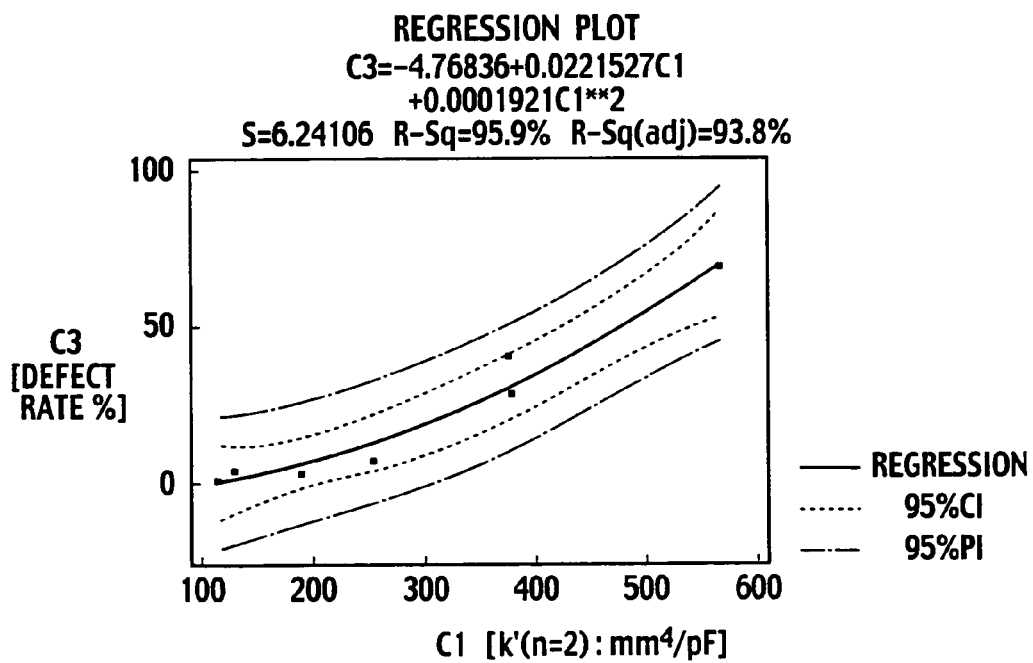

FIGS. 6A and 6B show defect rates caused by electro static discharge. In the graphs of both FIGS. 6A and 6B, the horizontal axes show values of k' and the lateral axes show defect rates at each value of k'. FIG. 6A shows a defect rate where n=1, whereas FIG. 6B shows a defect rate where n=2. Both defect rates are well approximated in the squared graphs. The values of k' at the defect rate of 1% are obtained by regression calculation. As a result, k' becomes 0.40 (mm³/pF) where n=1, and k' becomes 125 (mm⁴/pF) where n=2.

In production processes, yield is stabilized when a defect rate due to a single cause is 1% or lower. Therefore, it is considered reasonable to use the above values of k' as standard values (set values). Of course, the smaller the value of k', the more effectively the defect rate is lowered.

Second Embodiment

Figure 8:
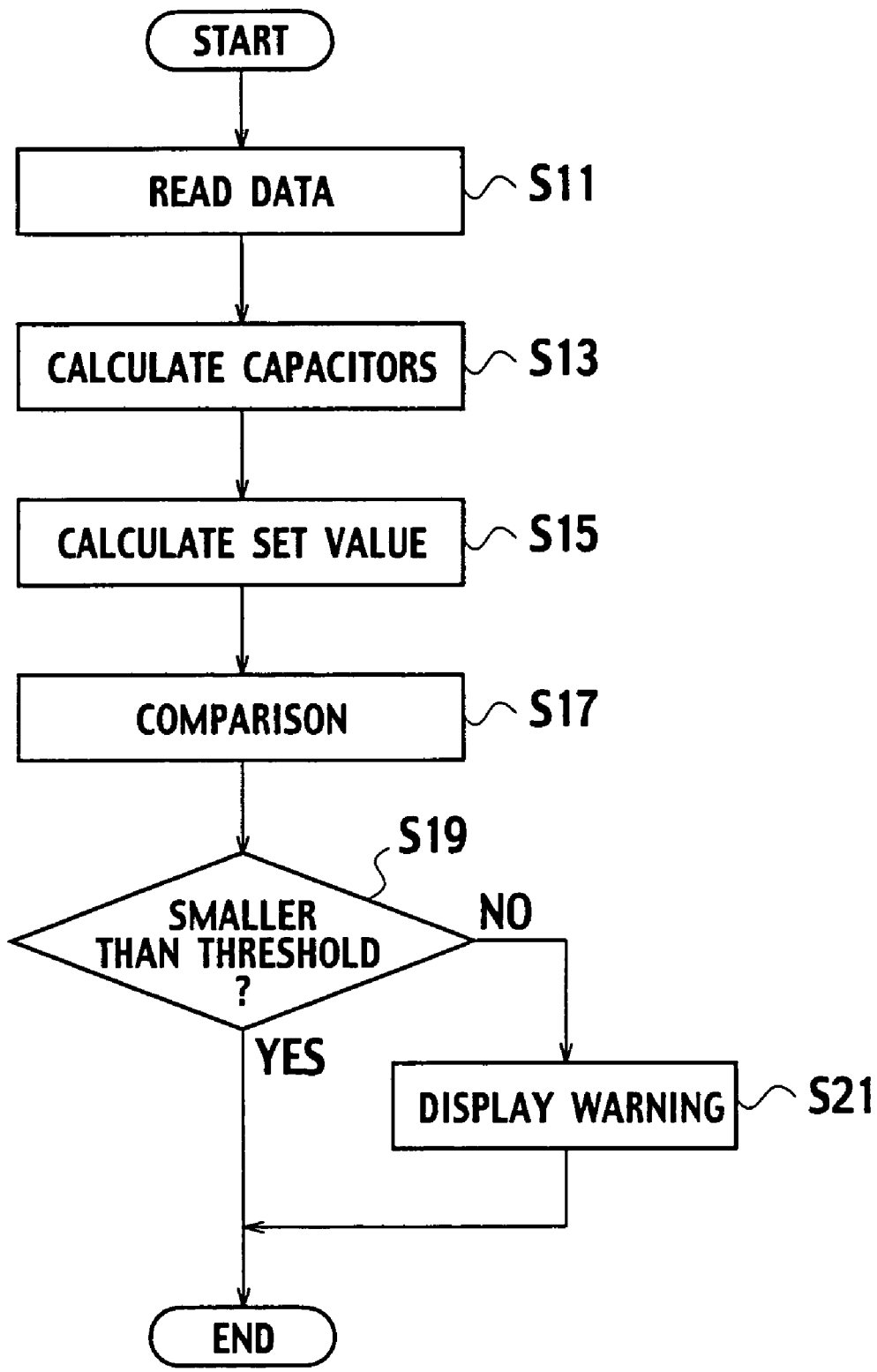
FIG. 8 is a flowchart showing a flow of warning process in the second embodiment of the present invention.

A CAD system according to the second embodiment of the present invention is described with reference to FIGS. 7 and 8. FIG. 7 is a functional block diagram showing the structure of the CAD system of the second embodiment. FIG. 8 is a flowchart showing a flow of a warning process in the second embodiment.

As shown in FIG. 7, the CAD system of the second embodiment includes display means 71, a central processing unit (CPU) 73, a random access memory (RAM) 75, input means 77, and storage means 79.

The input means 77 includes means for inputting letters and numbers, such as a keyboard, and a pointing device such as a mouse. It is used for inputting CAD data.

Storage means 79 is, for example, a hard disk drive (HHD) and stores a calculation program, a comparison program, a warning program, a drawing program, CAD data, an operating system (OS), a set value (threshold value) and the like.

Specific examples of the CAD data are lengths of the gate electrode lines, a surface area of the substrate, a material and shape of the gate electrodes as well as a length of each part of the same, material and shape of the semiconductor layer patterns as well as a length of each part of the same, a distance between the gate electrode lines and the bottom surface of the substrate, a distance between the gate electrode lines and the semiconductor layer patterns (a thickness of the gate insulator), a distance between the semiconductor layer patterns and the surface of the substrate (a thickness of the undercoat film), dielectric constants of the gate insulator and undercoat film, and a thickness and dielectric constant of the substrate. By using the drawing program, the semiconductor layer patterns, gate electrode lines, common capacitor lines are drawn on the display means based upon the CAD data.

The calculation program pre-calculates a unit capacitor between the semiconductor layer pattern and the metal table per unit area, a unit capacitor between the semiconductor layer pattern and gate electrode line per unit area, and a unit capacitor between the gate electrode line and the metal table per unit area, based upon thicknesses and dielectric constants of the gate insulator, the undercoat film and the substrate, respectively.

Thereafter, attentions are focused on the gate electrode lines and (a plurality of) semiconductor layer patterns overlapping them. A parallel plate capacitor Ca' is calculated for each of these semiconductor layer patterns that are focused based upon an area extracted from the shape of each semiconductor layer pattern. This parallel plate capacitor Ca' is made between the semiconductor layer pattern and its own projected pattern to the surface of the metal table.

Further, a parallel plate capacitor Cb' is calculated for each of the semiconductor layer patterns that are focused, based upon an overlap area extracted from the shape of an overlap portion between the semiconductor layer pattern and the gate electrode line. The parallel plate capacitor Cb' is made of only an overlap area between the semiconductor layer pattern and the gate electrode line. There will be n sets of Ca' and Cb'.

As for each of the electrode layer patterns that are focused, the extracted gate electrode line pattern overlaps n numbers of semiconductor layer patterns that are also focused. Within the gate electrode line, areas which do not overlap the semiconductor layer patterns are represented by regions 1 and areas which overlap the semiconductor layer patterns are represented by regions 2. The areas of the regions 1 are extracted and, based upon the extracted areas of the regions 1, a parallel plate capacitor C1 made between the regions 1 and the metal table is calculated. Capacitors C2n (a composition of capacitors), made between the respective regions 2n and the metal table through the semiconductor layer patterns, are calculated sequentially. A parallel plate capacitor made between the semiconductor layer pattern of the region 2n and the metal table is represented by C2a (n), and a parallel plate capacitor made of the overlap area between the semiconductor layer pattern in the region 2n and the gate electrode line that is focused is represented by C2b (n) In this case, C2a(n) and C2b(n) are neither more nor less than Ca' and Cb' for the nth semiconductor layer pattern calculated earlier, and the values thereof are thus used. C2(n)=(C2a(n)×C2b(n))/(C2a(n)+C2b(n)) is established.

Based on above, the capacitor Ce' between the gate electrode line and the metal table is calculated using the equation Ce'=ΣC1(m)+ΣC2(n). Where C2(n) represents a common thus an invariable value, in other words, where C2(1)=C2(2)= . . . =C2(n) is established, the above equation can be simplified to Ce'=C1+n×C2n.

Next, the surface is divided, for example, into meshes of micro-regions. A surface area which "the gate electrode line is in charge of" is calculated by summing up the micro regions where the focused gate electrode line is most adjacent, thus obtaining a substrate surface area S that the focused gate electrode line is in charge of per unit length. Thereafter, the value of k' is calculated using the following equation.

$$k'=(L/Ce')\times\{Ca'/(Ca'+Cb')\}\times S$$

The definitions of "that the gate electrode is in charge of" and "S" will be detailed later with reference to FIG. 9A. S may be extracted by recurrence plot calculation without using the software stated above as long as S is formed by simple repetition of pixel regions. For example, if there are m numbers of parallel lines within a quadrangle having sides parallel with the gate electrode line as well as a unit area, an area that one gate electrode line is in charge of can be approximated by 1/m.

The comparison program compares the calculated value of k' to the set value (threshold value) and determines whether the value of k' is or is not smaller than the set value.

Where the value of k' is not smaller than the set value, the warning program passes to the drawing program data indicating the presence of a point where the value of k' is not smaller than the set value, as well as X and Y coordinates which specify such point.

Upon receipt of the data indicating the presence of the point where the value of k' is not smaller than the set value, the drawing program gives a warning by causing the display means to display a massage notifying the presence of the point which is highly likely to have electro static discharge or by causing the display means to display the location of the point, specified by the X and Y coordinates transmitted from the warning program, on the semiconductor substrate design drawing. For example, the drawing program causes flickers at the point where the value of k' is not smaller than the set value or changes the color of the point into an alert color such as red.

The display means 71 is, for example, a CRT display, a liquid crystal display, an EL display, and a plasma display.

The CPU 73 executes processes such as calculation in accordance with the respective programs such as the drawing program and the calculation program.

The RAM 75 is, for example, a dynamic random access memory (DRAM). The RAM 75 is used as a work area for the respective programs such as the calculation program.

As shown in FIG. 8, the CAD system of the second embodiment reads data at step S11. Data to be read by the CAD system includes data for calculating the parallel plate capacitor Ca' made between the semiconductor layer pattern and its own projected pattern to the surface of the metal table, data for calculating the parallel plate capacitor Cb' made only of the overlap area between the semiconductor layer pattern and the gate electrode line, data for calculating the parallel plate capacitor Ce' made between the gate electrode line and its own projected pattern to the surface of the metal table, data of the length L of the gate electrode line, data for calculating the substrate surface S that one gate electrode line is in charge of per unit length, and the like.

In step S13, the capacitors Ca', Cb' and Ce' are calculated. In step S15, the substrate surface S, which one gate electrode line is in charge of per unit length, is calculated, and an evaluation value (a value of k') is calculated using the following equation:

$$k'=(L/Ce')\times\{Ca'/(Ca'+Cb')\}\times S$$

In step S17, the evaluation value (the value of k') and the set value (the threshold value) are compared to each other. Where the evaluation value is smaller than the set value (YES in step S19), the process ends. Where the evaluation value is not smaller than the set value (NO in step S19), a warning is displayed (step S21). As stated earlier, the warning is made as flicker of the point where the evaluation value is not smaller than the set value, i.e. the point which is highly likely to cause electro static discharge, or by changing the color of such point to a prominent color.

As described so far, design management using K, k, k' or k" according to the present invention reduces point defects caused by electro static discharge, thus dramatically improving manufacturing yield of a liquid crystal display device using the thin-film transistor substrate. The reasons why electro static discharge is suppressed are understood as follows.

Figure 9A:
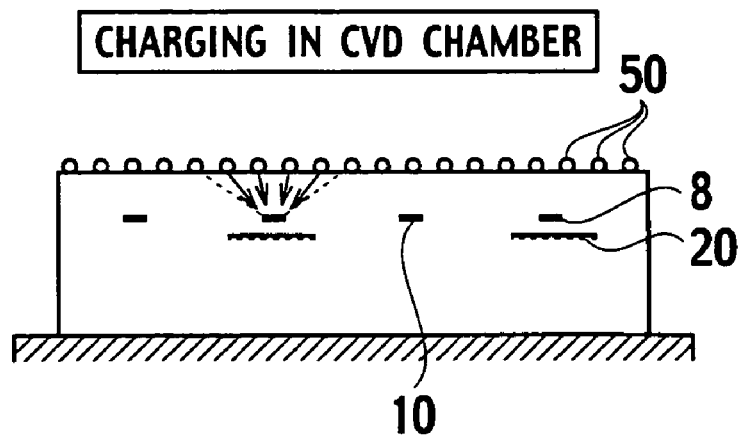
FIG. 9A is a view showing an image of a thin-film transistor substrate charged within a CVD chamber and 9B is a plan view of the substrate shown in FIG. 9A.

FIG. 9A shows an image of a substrate charged within a CVD chamber. Conventionally, gate electrode lines 8 are formed above semiconductor layer patterns 20, respectively, and each common capacitor line 10 is formed between the gate electrode lines 8. An assumption is then made that charges 50 due to the charging flow into a gate electrode line proportionately with the surface area of the substrate. Now, attention is focused on one of the gate electrode lines 8. Charges flow into this gate electrode line 8 proportionately with a surface area that this gate electrode line is in charge of.

Figure 9B:
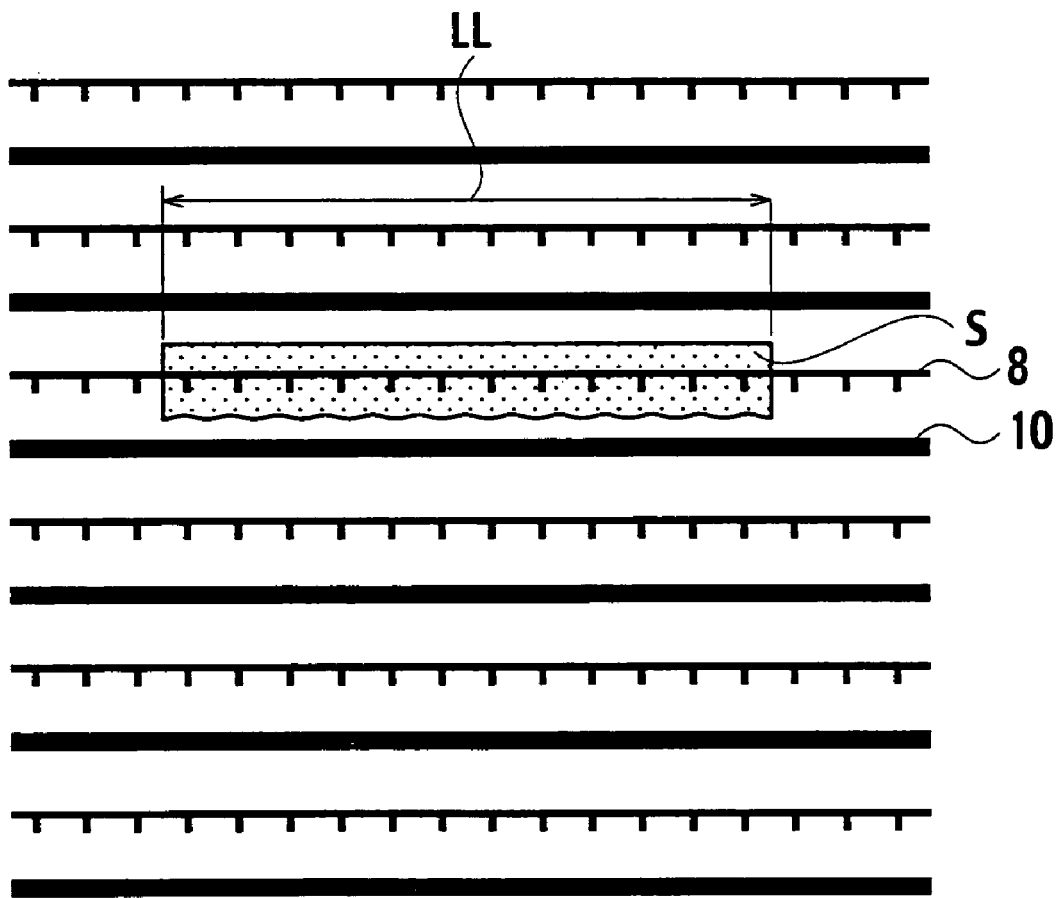

FIG. 9B is a plan view of the thin-film transistor substrate shown in FIG. 9A. The substrate surface area S that one gate electrode line is in charge of per unit length is described using FIG. 9B.

First of all, attention is focused on the gate electrode line 8 with a unit length LL. Next, attention is also focused on the common capacitor line 10 with a unit length LL, made of a metal thin film same as that for the gate electrode line 8. Arbitrary points on the substrate surface are classified by the line most adjacent to these points. (This can also be described that these points belong to the line). An area of the shaded region thus becomes the surface area S that one gate electrode line 8 is in charge of per unit length.

(1) Where a surface area per unit length of one gate electrode line 8 is represented by S, and the length of one gate electrode line is represented by L, it can be understood that there are charges proportional to "S×L" on one gate electrode line, although multiplied by coefficient(s). Further, where the lines 8 and 10 are located almost equally and their lengths are almost the same, S may be substituted by the substrate surface area/(the total number of the lines 8 and 10)/the length of the lines. In other words, the shapes of the gate electrode lines in plan view may be regarded as simple rectangular shapes.

Figure 10A:
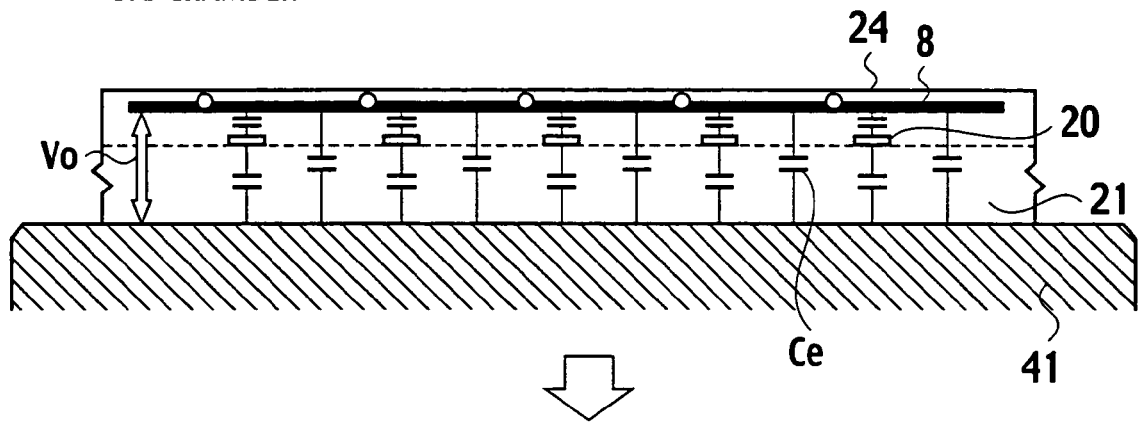
FIG. 10A is a view showing a charged state of a substrate within a CVD chamber and 10B is a view showing a charged state of the substrate while the substrate is transferred.

(2) FIG. 10A shows a charged state of a substrate within a CVD chamber. The glass substrate 21 is mounted on a stage (a metal table) 41, and the semiconductor patterns 20 made of polysilicon, the gate electrode lines 8 and the interlayer insulator 24 are formed on the glass substrate 21. As shown in FIG. 10A, in practice, charges are accumulated in gate electrode line capacitors Ce. Therefore, in this case, the voltage is proportional to "1/Ce". This is the state in the CVD chamber.

Where charges of the entire gate electrode line is represented by $Q_0$, a capacitor between the entire gate electrode line 8 and the entire stage 41 is represented by $C_0$, and a voltage between the gate electrode line 8 and the stage 41 is represented by $V_0$, a relationship of $Q_0=C_0*V_0$ or a relationship of $V_0=Q_0/C_0$ is established.

Figure 10B:
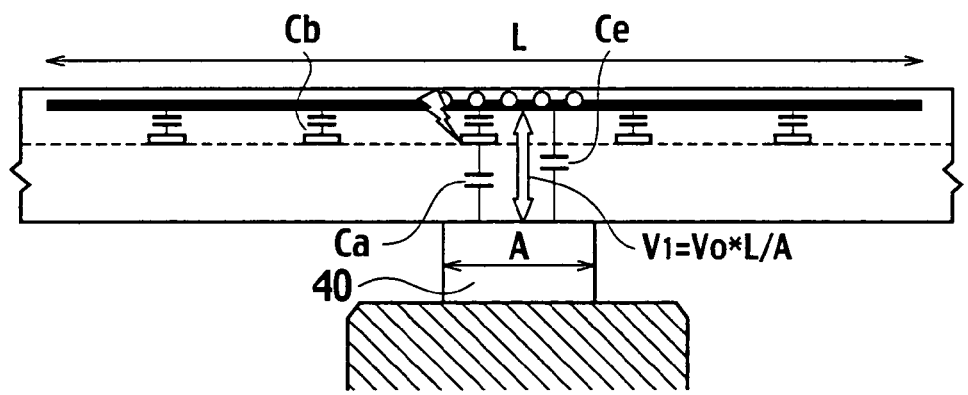

(3) FIG. 10B shows a charged state of the substrate while being transferred. As shown in FIG. 10B, while the substrate is transferred, the entire charges in one gate electrode line 8 are concentrated to a location above a support portion 40. Hence, a gate electrode line voltage $V_1$ rises in proportion to the length L of the line. If the support portion 40 comes into contact with the substrate 21 evenly, a gate electrode line voltage $V_0$ is inversely proportional to the width A of the support portion 40. In reality, however, the support portion 40 and the substrate 21 come into contact with each other at points due to distortion of the substrate 21 or vibration. Therefore, it may be understood that the gate electrode line voltage $V_0$ is, as an extremum, in proportional to the length L of the line.

To be more specific, a capacitor above the support portion 40 becomes $C_0*A/L$, and, where the voltage applied between the gate electrode line and the support portion 40 is represented by $V_1$, the following equation is established:

$$V_1=Q_0/(C_0*A/L)=V_0*(L/A)$$

(4) In such a case, where a voltage applied between the silicon semiconductor layer pattern 20 and the gate electrode line 8 is represented by $V_{SiO}$, a capacitor between the semiconductor pattern 20 and the support is represented by Ca, and a capacitor between the semiconductor layer pattern and the gate electrode line is represented by Cb, the following equation is established:

$$V_{SiO}=V_1*\{Ca/(Ca+Cb)\}$$

According to the above descriptions (1) to (4), the following equation is established:

$$V_{SiO}=(L^2/Ce)\times\{Ca/(Ca+Cb)\}\times S$$

According to the experimental results in FIG. 6, good approximation was obtained also from $(L/Ce)\times\{Ca/(Ca+Cb)\}\times S$. Therefore, it is preferred to have to two checks; weather $(L/Ce)\times\{Ca/(Ca+Cb)\}\times 2$ is smaller than the first set value and whether $(L^2/Ce)\times\{Ca/(Ca+Cb)\}\times S$ is smaller than the second set value.

The configuration of the present invention is particularly effective for a top-gate-type polysilicon thin-film transistors described in the foregoing embodiments. In addition, the present invention is also particularly effective for such transistors with large substrate or screen (long gate electrode lines). The present invention has been described with regard to TFTs in pixel regions. However, the same configuration can be applied to circuits, such as the gate line driving circuit 11, the signal line driving circuit 12, and the capacitor driving circuit 13, where they are fabricated using TFTs.

Third Embodiment

Figure 11:
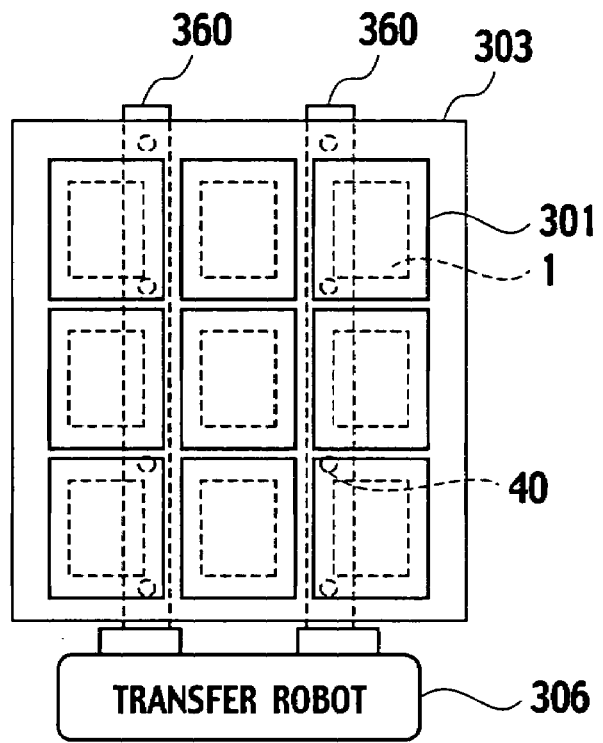
FIG. 11 is a view showing a positional relationship between substrate support pads and pixel regions in transferring a transfer board on which nine thin-film transistor substrates are mounted.
Figure 12:
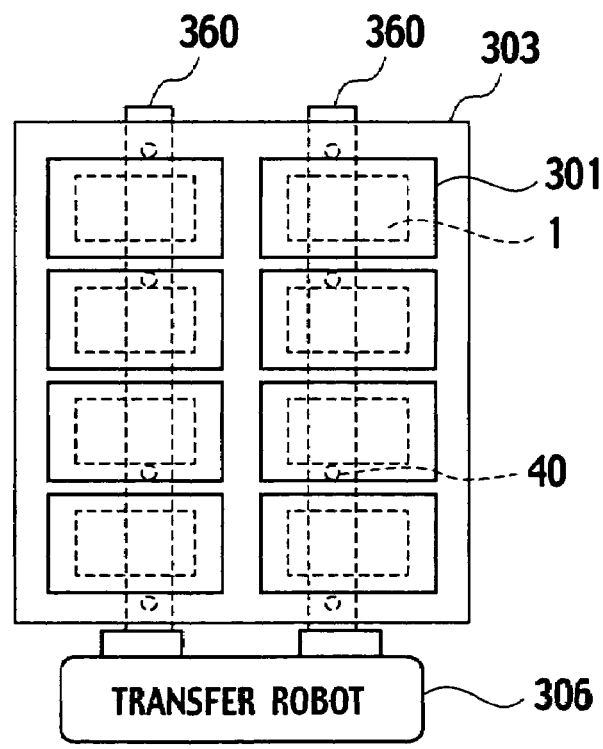
FIG. 12 is a view showing a positional relationship between substrate support pads and pixel regions while transferring a transfer board on which eight thin-film transistor substrates are mounted.

FIGS. 11 and 12 show transfer methods used when transferring a thin-film transistor substrates 301 by a transfer robot 306.

Usually, the thin-film substrates 301 are transferred by using a transfer board 303 and the transfer robot 306. On one transfer board 303, the plurality of thin-film transistor substrates 301 are attached. For example, nine thin-film transistor substrates 301 or eight thin-film transistor substrates 301 are attached to one transfer board 303 as shown in FIGS. 11 and 12, respectively. Thereafter, these substrates are transferred while board support pads (board support portions) 40, provided on arms of the transfer robot 306, support the transfer board 303. These board support pads 40 support the support points set on the lower side of the substrates 301 outside the pixel regions 1. Each pixel region 1 is, for example, 730 mm×920 mm.

By setting the support points outside the pixel regions 1, it is possible to prevent electro static discharge which occurs in the scan lines 8 or signal lines 9 due to concentration of charges dispersed on the scan lines 8 and signal lines 9 to points above the support pads 40.

When transferring one thin-film transistor substrate 301 where a plurality of circuit patterns is not adhered, it is also possible to prevent line breakage due to static electricity by supporting the substrate 301 at points outside its pixel region 1.

Note that, by using a transfer method similar to the above, it is possible to prevent breakage of lines due to static electricity from occurring in an electro-luminescence (EL) display device, a device provided with luminescent material instead of a liquid crystal.

What is claimed is:

1. A thin-film transistor substrate including pixel regions where gate electrode lines are arrayed on an insulating substrate sandwiching semiconductor layer patterns and gate insulators with the substrate, wherein shapes of the semiconductor layer patterns and the gate electrode lines are set so that a value of k' obtained from the following equation in case of n=1 is 0.40 (mm$^3$/pF) or lower when the thin-film transistor substrate is mounted on a metal table:

$$k'=(L^n/Ce')\times\{Ca'/Ca'+Cb')\}\times S$$

where capacitors constructing a capacitor between each of the semiconductor layer patterns and the metal table, a capacitor between each of the semiconductor layer patterns and each of the gate electrode lines, and a capacitor between each of the gate electrode lines and the metal table are calculated approximately as parallel plate capacitors of overlap areas, respectively, whereby, a parallel plate capacitor made between each of the semiconductor layer patterns and a projected pattern of the semiconductor layer pattern to a surface of the metal table is represented by Ca', a parallel plate capacitor made only by an overlap area between each of the semiconductor layer patterns and each of the gate electrode lines is represented by Cb', and a capacitor between each of the gate electrode lines and the metal table, obtained by composition calculation using Ca' and Cb', is represented by Ce', a length of each of the gate electrode lines is represented by L, and a substrate surface area that one of the gate electrode lines is in charge of per unit length is S.

2. The thin-film transistor substrate according to claim 1, wherein the shapes of the semiconductor layer patterns and the gate electrode lines are set so that a value of k' obtained from the following equation in case of n=2

$$k'=(L^n/Ce')\times\{Ca'/(Ca'+Cb')\}\times S$$

is 125 (mm$^4$/pF) or lower.

3. The thin-film transistor substrate according to claim 2, wherein a 150 nm-thick silicon oxide film is used for the gate insulator.

4. The thin-film transistor substrate according to claim 1, wherein the insulating substrate is made of a glass substrate, the semiconductor layer patterns are made of polysilicon thin films, the gate insulator is made of a thin film containing silicon oxide, and an interlayer insulator formed by plasma CVD on the gate electrode lines.

5. The thin-film transistor substrate according to claim 1, wherein a 150 nm-thick silicon oxide film is used for the gate insulator.

6. The thin-film transistor substrate according to claim 4, wherein a size of the glass substrate is larger than 730 mm×920 mm.

7. A display device comprising:
the thin-film transistor substrate according to claim 1; and
a display material including a liquid crystal material or an EL material.

* * * * *